United States Patent
Nakagiri et al.

(10) Patent No.: US 7,045,198 B2
(45) Date of Patent: May 16, 2006

(54) PREPREG AND CIRCUIT BOARD AND METHOD FOR MANUFACTURING THE SAME

(75) Inventors: Yasushi Nakagiri, Kyotanabe (JP); Takeshi Suzuki, Izumi (JP); Fumio Echigo, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 379 days.

(21) Appl. No.: 10/280,762

(22) Filed: Oct. 24, 2002

(65) Prior Publication Data

US 2003/0082363 A1 May 1, 2003

(30) Foreign Application Priority Data

Oct. 25, 2001 (JP) .................. 2001-328274

(51) Int. Cl.
B32B 15/00 (2006.01)

(52) U.S. Cl. .............. 428/209; 427/97.1; 427/98.2; 427/98.8; 257/750; 257/774; 257/798; 361/749

(58) Field of Classification Search .......... 428/209, 428/901, 304.3, 321.3; 427/97, 97.1, 97.7, 427/98.8, 98.2; 257/774, 750, 796; 264/319; 156/634, 643, 645, 655, 901, 902
See application file for complete search history.

(56) References Cited

U.S. PATENT DOCUMENTS

| | | | |
|---|---|---|---|
| 4,005,238 A | | 1/1977 | Gaehde et al. |
| 4,911,771 A | | 3/1990 | Tanaka et al. |
| 5,065,227 A | * | 11/1991 | Frankeny et al. .......... 257/778 |
| 5,316,787 A | * | 5/1994 | Frankeny et al. .............. 427/97 |
| 5,346,750 A | | 9/1994 | Hatakeyama et al. |
| 5,436,062 A | * | 7/1995 | Schmidt et al. ............. 428/209 |
| 5,888,627 A | * | 3/1999 | Nakatani ................... 428/209 |
| 6,197,407 B1 | | 3/2001 | Andou et al. |
| 2002/0037397 A1 | | 3/2002 | Suzuki et al. |
| 2002/0053465 A1 | | 5/2002 | Kawakita et al. |

FOREIGN PATENT DOCUMENTS

| | | |
|---|---|---|
| JP | 63-97635 | 4/1988 |
| JP | 2-181997 | 7/1990 |
| JP | 5-299796 | 11/1993 |
| JP | 6-268345 | 9/1994 |
| JP | 2002-094200 | 3/2002 |
| JP | 2002-176268 | 6/2002 |

* cited by examiner

*Primary Examiner*—Merrick Dixon
(74) *Attorney, Agent, or Firm*—Merchant & Gould P.C.

(57) ABSTRACT

The present invention provides a prepreg and a circuit board that can achieve, e.g., low interstitial via connection resistance, excellent connection stability, and high durability, regardless of materials, physical properties, and a combination of the materials of an insulating layer. The present invention also provides a method for manufacturing the prepreg and the circuit board. The prepreg of the present invention includes a laminate including at least one first layer and at least one second layer. The first layer is an insulating layer that includes a resin. The second layer has pores that connect an upper and a lower surface of the second layer, and the upper and the lower surface of the second layer differ from each other in at least one selected from open are ratio and average pore diameter. Using this prepreg makes it possible to provide a circuit board that is characterized, e.g., by low interstitial via connection resistance, excellent connection stability, and high durability.

12 Claims, 7 Drawing Sheets

PREPREG AND CIRCUIT BOARD AND METHOD FOR MANUFACTURING THE SAME

BACKGROUND OF THE INVENTION

1. Field of the Invention

The present invention relates to a prepreg, a circuit board, and a method for manufacturing the prepreg and the circuit board.

2. Description of the Related Art

In recent years, with a trend toward compact lightweight high-performance electronic equipment, there has been a growing demand for low-cost multilayer circuit boards that can achieve high-density mounting of semiconductor chips such as LSIs in the field of home electronic applications. To meet this market demand, the technology has been developed to make resin multilayer circuit boards, which can be supplied at lower cost, suitable for high-density mounting, instead of conventionally mainstream ceramic multilayer circuit boards. Examples of such resin multilayer circuit boards include a circuit board having an Interstitial Via Hole (hereinafter, referred to as IVH) structure in all layers, as disclosed in JP 6(1994)-268345 A.

A resin multilayer circuit board having the IVH structure in all layers uses a composite material, including a nonwoven aramid reinforcing material and an epoxy resin, as an insulating layer. This circuit board adopts an IVH connection between layers, with which any wiring pattern layers can be connected electrically at desired positions through a conductive paste. Thus, the resin multilayer circuit board characterized by the IVH structure in all layers is relatively inexpensive and suitable for high-density mounting.

The above conventional technique requires a prepreg obtained by impregnating the nonwoven aramid reinforcing material with the epoxy resin while leaving a hollow inside. That is, the conventional technique cannot be realized unless a specific material is used. However, there is a wide variety of circuit boards the market demands, e.g., a circuit board that has a low dielectric constant and is suitable for high-speed transmission or a circuit board that can achieve both high-density mounting and high heat resistance, in addition to a circuit board that enables high-density mounting. Thus, it is necessary to provide a circuit board suitable for high-density mounting by using any materials with desired physical properties.

SUMMARY OF THE INVENTION

Therefore, with the foregoing in mind, it is an object of the present invention to provide a prepreg and a circuit board that can achieve low interstitial via connection resistance and excellent connection stability without depending on a combination of materials to be used, and a method for manufacturing the prepreg and the circuit board.

A prepreg of the present invention includes a laminate of at least one first layer and at least one second layer. The first layer is an insulating layer that includes a resin. The second layer has pores that connect an upper and a lower surface of the second layer. The upper and the lower surface of the second layer differ from each other in at least one selected from open area ratio and average pore diameter.

A circuit board of the present invention includes an integral insulating layer and a wiring pattern layer, the integral insulating layer including at least one first insulating layer and at least one second insulating layer. The wiring pattern layer is deposited on at least one surface of the integral insulating layer. The first insulating layer includes a resin. The second insulating layer has pores that connect an upper and a lower surface of the second insulating layer, and the resin included in the first insulating layer is arranged in the pores. The upper and the lower surface of the second insulating layer differ from each other in at least one selected from open area ratio and average pore diameter.

A method for manufacturing a prepreg of the present invention includes: (i) forming a first layer that is an insulating layer including a resin; and (ii) forming a laminate of the first layer and a second layer by stacking the second layer on at least one surface of the first layer. The second layer has pores that connect an upper and a lower surface of the second layer, and the upper and the lower surface of the second layer differ from each other in at least one selected from open area ratio and average pore diameter.

A method for manufacturing a circuit board of the present invention includes: (I) forming a first layer that is an insulating layer including a resin; (II) forming a laminate of the first layer and a second layer by stacking the second layer on at least one surface of the first layer; (III) forming holes through the laminate in a thickness direction and filling the holes with a conductive paste; and (IV) compressing the laminate in the thickness direction by applying pressure so that the resin included in the first layer flows into the second layer and the conductive paste is compressed into an electrical conductor. The method further includes: (Z) depositing at least one selected from a metal foil and a wiring pattern on at least one surface of the laminate, and the (Z) is performed after (II) and before (IV). The second layer has pores that connect an upper and a lower surface of the second layer, and the upper and the lower surface of the second layer differ from each other in at least one selected from open area ratio and average pore diameter.

DESCRIPTION OF THE PREFERRED EMBODIMENTS

Figure 1A:
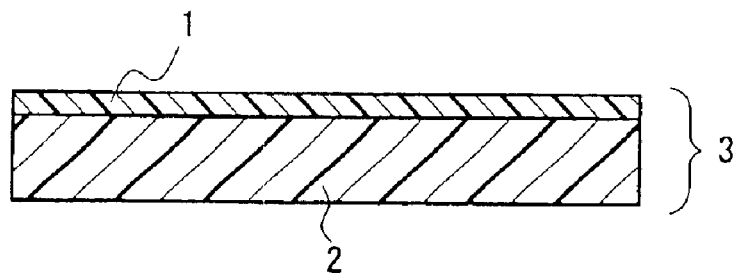
FIG. 1A is a schematic cross-sectional view showing an example of a prepreg of the present invention.

A prepreg of the present invention includes a laminate of at least one first layer and at least one second layer. The first layer is an insulating layer that includes a resin. The second layer has pores that connect an upper and a lower surface of the second layer. The upper and the lower surface of the second layer differ from each other in at least one selected from open area ratio and average pore diameter.

When this prepreg is heated and pressed, the resin included in the first layer melts and flows into the pores of the second layer. Therefore, the prepreg can have high compressibility without depending on the materials and types of the first layer. Since the upper and the lower surface of the second layer have different open area ratio and/or average pore diameter, the flow rate and the amount of resin flowing into the pores of the second layer can be controlled in accordance with the melt viscosity characteristics of the resin included in the first layer. When this prepreg is used to produce a circuit board, a conductive paste can be compressed effectively, regardless of the materials for the first layer that serves as an insulating layer. Thus, a circuit board with low electrical connection resistance and excellent connection stability can be provided. Here, "open area ratio" is defined as the ratio of the total pore area on a surface to the area of the surface. The open area ratio and the average pore diameter can be measured, e.g., with an optical microscope, an electron microscope, or the like.

The first layer is not particularly limited, as long as it has electrically insulating properties and includes a resin that can flow into the second layer when the prepreg is heated and pressed. Examples of the first layer include a layer that has an insulating core impregnated with resin and a resin sheet. As a layer having the above structure, e.g., a commercially available prepreg can be used. The commercially available prepreg is not particularly limited, but can be a glass epoxy prepreg, an aramid epoxy prepreg, or the like. Examples of the resin sheet include epoxy resin, polyimide resin, bismaleimide triazine resin, polyphenylene ether resin, cyanate ester resin, and polytetrafluoroethylene (PTFE) resin. It is also possible to mix different types of resins or to stack different types of resin layers. For the resin sheet, an adhesive sheet can be used as well.

The following is an explanation of an adhesive sheet used as the first layer. The adhesive sheet is a film made of thermoplastic resin or thermosetting resin, such as polyimide, liquid crystal polymer, aramid and PTFE, and a thermoplastic adhesive or semi-cured thermosetting adhesive is applied to both or either of the surfaces of the film. The type of adhesive is not particularly limited, and can be selected arbitrarily according to the film and a combination of metals to be used for a wiring pattern layer. However, the adhesive needs to have flowability while the prepreg is heated and pressed so as to flow into the second layer. Therefore, when the thermosetting adhesive is used, the adhesive is preferred to be in the semi-cured state. When the thermoplastic adhesive is used, it is preferable that the prepreg is heated at a temperature not less than the softening temperature of the adhesive, thus allowing the adhesive to flow.

The adhesive is not particularly limited. For example, an epoxy adhesive, polyimide adhesive or acrylic adhesive can be used as the thermosetting adhesive, and a polyamide adhesive or polyphenylene ether (PPE) adhesive can be used as the thermoplastic adhesive. A film made of thermoplastic resin exhibits adhesive properties at a temperature not less than the softening temperature of the film and can be used as the adhesive layer by itself.

The second layer has pores that connect its upper and lower surfaces. However, not all the pores must connect both surfaces of the second layer. The second layer does not necessarily need to be porous and can be a structure such as woven or nonwoven fabric. The woven or nonwoven fabric may be made of either organic or inorganic material, as long as any space is present in the second layer.

A difference in open area ratio between the upper and the lower surface of the second layer is, e.g., in the range of 1% to 20%, and preferably in the range of 2% to 15%. For a prepreg including a first layer (epoxy layer) and a second layer (aramid layer), the open area ratio of one surface of the aramid layer that is in contact with the epoxy layer is preferably in the range of 7% to 10%, and more preferably in the range of 9% to 10%. The open area ratio of the other surface of the aramid layer is preferably in the range of 10% to 13%, and more preferably in the range of 11% to 12%.

A difference in average pore diameter between the upper and the lower surface of the second layer is, e.g., in the range of 0.03 μm to 5 μm, and preferably in the range of 0.05 μm to 2 μm. For the above two-layer prepreg, the average pore diameter of one surface of the aramid layer that is in contact with the epoxy layer is preferably in the range of 0.01 μm to 0.2 μm, and more preferably in the range of 0.03 μm to 0.1 μm. The average pore diameter of the other surface of the aramid layer is preferably in the range of 0.2 μm to 2 μm, and more preferably in the range of 0.2 μm to 0.5 μm.

The relative relationship in open area ratio between the upper and the lower surface of the second layer may be changed depending on materials for the first and the second layer. For a prepreg including a first layer (polyphenylene ether layer) and a second layer (aramid layer), it is preferable that the open area ratio of one surface of the aramid layer that is in contact with the polyphenylene ether layer is larger than that of the other surface. The same is true for the relative relationship in average pore diameter.

The second layer can be a porous layer. The porous layer is excellent in absorbing molten resin, so that the compressibility of a prepreg can be improved further.

A material for the porous layer is not particularly limited. For example, a porous sheet including PTFE, polyimide, aramid or liquid crystal polymer can be used. It is particularly preferable to use a commercially available PTFE sheet or film ("Gore-Tex," manufactured, e.g., by Japan Gore-Tex Inc.), which has an average pore diameter of about submicron (0.1 μm) to several microns (9 μm). The PTFE material is preferred particularly in manufacturing a circuit board for a high frequency circuit because of its low dielectric constant.

Even if the second layer is a porous layer, the upper and the lower surface of the second layer should be connected with at least one pore. For example, the at least one pore is not in the form of bubbles that are present separately in the second layer.

The porosity of the second layer is, e.g., in the range of 20 vol. % to 80 vol. %, and preferably in the range of 50 vol.

% to 70 vol. %. These ranges can provide more suitable compressibility of a prepreg for producing a circuit board and more favorable electrical connection between the wiring pattern layers that is made by the compression of a conductive paste.

A prepreg of the present invention may include a plurality of alternate layers of the first layers and the second layers. When the prepreg is heated and pressed, a resin in each of the first layers flows into the second layers arranged inside the prepreg, so that the compressibility of the prepreg can be improved further.

In particular, when both outermost layers are the second layers, the outermost layers may differ from each other in average pore diameter and/or porosity. This can make the degree of compression on one surface of the prepreg different from that on the other surface while the prepreg is heated and pressed. Thus, the compression of the prepreg can be controlled arbitrarily, e.g., in accordance with a difference in material for an additional layer or difference in through hole diameter between the upper and the lower surface of the prepreg.

In a prepreg of the present invention, the resin included in the first layer may be arranged in the pores of the second layer in contact with the first layer. This prepreg can achieve good interlayer bonding, handling, and perforating etc. because part of the resin included in the first layer has flowed into the second layer. Moreover, when the prepreg is heated and pressed, it becomes easier for the molten resin of the first layer to flow into the second layer.

In a prepreg of the present invention, the first layer may include a filler. For example, when a commercially available prepreg is used as the first layer, a woven or nonwoven reinforcing material can be impregnated with a filler-containing resin. Examples of the first layer containing a filler include a filler-containing glass epoxy prepreg obtained by impregnating glass woven fabric with an epoxy resin in which silica particles are dispersed. When a resin sheet is used as the first layer, the resin also may include a filler.

As the filler, e.g., an insulating filler such as silica, alumina and aluminum hydroxide can be used. The type of filler may be selected according to the necessary characteristics for a circuit board. For example, an aluminum hydroxide filler can impart fire resistance to a circuit board without requiring halogen substances, thus achieving an environmentally friendly circuit board.

When the first layer includes a filler, it is preferable that the average pore diameter of the second layer is smaller than the average particle size of the filler, so that the filler particles do not obstruct seriously the molten resin flowing into the second layer. It is more preferable that the average pore diameter of the second layer is not more than the minimum particle size of the filler. This can make it difficult for the filler in the first layer to flow into the second layer while the prepreg is heated and pressed, and thus the prepreg can be compressed more efficiently A prepreg of the present invention may have a compressibility, e.g., in the range of 2% to 30%. By using this prepreg, a circuit board with low connection resistance and excellent durability can be produced efficiently.

The above compressibility can be given by $$\text{Compressibility (\%)} = ((T_0 - T_L)/T_0) \times 100 \qquad \text{Eq. 1}$$

where $T_0$ represents an average thickness of the prepreg before being compressed and $T_L$ represents an average thickness of the prepreg after being compressed.

The compressibility of the prepreg can be controlled, e.g., by changing the ratio of the total capacity of pores in the second layer to the total volume of prepreg. The total capacity of pores in the second layer can be controlled, e.g., by adjusting the porosity and the thickness of the second layer. This is because the total capacity of pores is proportional to the product of the porosity and the volume of the second layer.

A method for manufacturing a prepreg of the present invention includes: (i) forming a first layer that is an insulating layer including a resin; and (ii) forming a laminate of the first layer and a second layer by stacking the second layer on at least one surface of the first layer. The second layer has pores that connect the upper and the lower surface of the second layer, and the upper and the lower surface of the second layer differ from each other in at least one selected from open area ratio and average pore diameter.

This manufacturing method can provide a prepreg with high compressibility that allows the conductive paste to be compressed effectively in producing a circuit board, regardless of the materials for the first layer that serves as an insulating layer. The first and the second layer are the same as those of a prepreg of the present invention described above.

In the above method, (ii) may include: (ii-a) applying a solution of resin included in the second layer to a base material; (ii-b) setting the resin included in the second layer into a gel; (ii-c) forming the second layer on the base material by washing and drying the gelled resin; and (ii-d) stacking the second layer on at least one surface of the first layer. These processes efficiently can provide a laminate of the first layer and the second layer whose upper and lower surfaces differ from each other in at least one selected from open area ratio and average pore diameter.

The base material is not particularly limited, as long as it is in the form of a film. For example, a polyethylene terephthalate (PET) film or polyethylene naphthalate (PEN) film can be used. A release film also can be used to remove the second layer from the base material easily in the subsequent process.

As the resin included in the second layer, the above resin for the second layer of a prepreg of the present invention can be used, e.g., aramid or polyimide.

In the case of aramid, m-aramid is preferred. Though p-aramid also can be used, sulfuric acid is needed as a solvent to dissolve the p-aramid. Therefore, a solvent replacement, which will be described later, is easier for m-aramid than for p-aramid. Thus, m-aramid is superior to p-aramid in workability (m-aramid dissolves in an aprotic polar solvent, such as N-methyl-2-pyrrolidone (NMP) and dimethylformamide (DMF)).

The application of the solution of resin included in the second layer to the base material may be performed by well-known methods, e.g., roll coating, curtain coating, spray coating, or kiss-roll coating.

The gelation of the resin included in the second layer may be performed, e.g., by adding a gelling agent to the resin solution beforehand or replacing a solvent in the solution with another solvent (i.e., wet solidification). As another solvent for the replacement, it is preferable to use a solvent that will not dissolve the resin in the second layer. In the case of m-aramid, the solvent should be replaced by water or alcohol.

The washing and drying of the gelled resin may be performed by well-known conventional methods. For example, the gelled resin can be washed with running water and dried with hot air.

The open area ratio and the average pore diameter on each of the upper and the lower surface of the second layer can be controlled, e.g., by adding an additive to the resin solution that is applied to the base material or adjusting the coating speed, the drying speed, and temperatures in each process. Examples of the additive include lithium nitrate and polyvinyl pyrrolidone.

In the above method, (ii) may include: (ii-A) applying a solution of resin included in the second layer to at least one surface of the first layer; (ii-B) setting the resin included in the second layer into a gel; and (ii-C) forming the second layer on at least one surface of the first layer by washing and drying the gelled resin. These processes efficiently can provide a laminate of the first layer and the second layer whose upper and lower surfaces differ from each other in at least one selected from open area ratio and average pore diameter. The method of gelation, the resin included in the second layer, etc. may be the same as those in the manufacturing method of a prepreg described above.

After the laminate is produced by applying the solution to one surface of the first layer, another second layer, which has been formed on the base material, can be stacked on the other surface of the first layer. It is also possible to perform these processes in inverse order.

A method for manufacturing a circuit board of the present invention includes: (I) forming a first layer that is an insulating layer including a resin; (II) forming a laminate of the first layer and a second layer by stacking the second layer on at least one surface of the first layer; (III) forming holes through the laminate in a thickness direction and filling the holes with a conductive paste; and (IV) compressing the laminate in the thickness direction by applying pressure so that the resin included in the first layer flows into the second layer and the conductive paste is compressed into an electrical conductor. The method further includes: (Z) depositing at least one selected from a metal foil and a wiring pattern on at least one surface of the laminate, and the (Z) is performed after (II) and before (IV), i.e., at any time after (II) and before (IV). The second layer has holes that connect an upper and a lower surface of the second layer, and the upper and the lower surface of the second layer differ from each other in at least one selected from open area ratio and average pore diameter. The first and the second layer are the same as those of a prepreg of the present invention described above. (I) and (II) are performed in the same manner as that of (i) and (ii) in the manufacturing method of a prepreg described above.

This manufacturing method can provide a circuit board with low electrical connection resistance and excellent connection stability.

Like the above manufacturing method of a prepreg, when the second layer is formed on a base material in (II), the second layer may be stacked on at least one surface of the first layer after removing the base material. The second layer also may be stacked on at least one surface of the first layer without removing the base material.

When the base material is not removed, the first layer and the second layer should be stacked in contact with each other in (II), and the base material can be removed at any time before (IV). When the base material is removed after (III), the conductive paste filled into the holes is increased by the amount corresponding to the thickness of the base material. Therefore, the conductive paste can be compressed further in (IV), thus achieving a circuit board with more excellent characteristics.

In (III), the holes may be formed as a through hole or non-through hole as required. When the holes do not penetrate the laminate, they are blind via holes.

In (III), when a metal foil or a wiring pattern is deposited already on one of the surfaces of the laminate, the holes should be formed from the opposite surface to the surface provided with the metal foil or the wiring pattern. In this case, the holes passing through the laminate but not through the metal foil or the wiring pattern are taken as the blind via holes.

When the metal foil is deposited on at least one surface of the laminate in the (Z), the method further may include: (V) processing the metal foil into a wiring pattern.

Methods for forming the holes, the wiring pattern, etc. will be described later.

A circuit board of the present invention includes an integral insulating layer and a wiring pattern layer, the integral insulating layer including at least one first insulating layer (third layer) and at least one second insulating layer (fourth layer). The wiring pattern layer is deposited on at least one surface of the integral insulating layer. The first insulating layer includes a resin. The second insulating layer has pores that connect an upper and a lower surface of the second insulating layer, and the resin included in the first insulating layer is arranged in the pores. The upper and the lower surface of the second insulating layer differ from each other in at least one selected from open area ratio and average pore diameter. This circuit board can be produced by the above manufacturing method of a prepreg and/or a circuit board. The layer having pores is the same as the second layer of the prepreg described above. The first insulating layer (third layer) and the second insulating layer (fourth layer) are obtained by compressing the first layer and the second layer of the prepreg.

Hereinafter, embodiments of the present invention will be described with reference to the drawings. The present invention is not limited by the following examples.

Embodiment 1

FIG. 1A is a schematic cross-sectional view showing an example of a prepreg of the present invention. In FIG. 1A, a prepreg 3 has a two-layer structure that includes a first layer 2 and a second layer 1 stacked on the first layer 2.

Figure 1B:
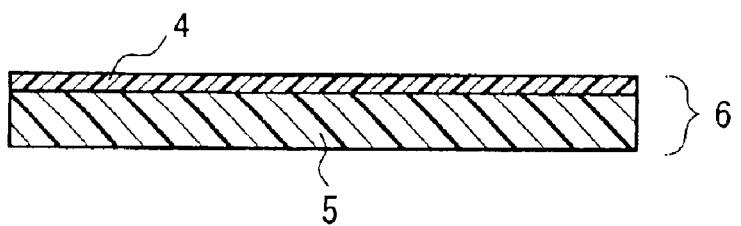
FIG. 1B is a schematic cross-sectional view showing a composite material obtained by compressing the prepreg in FIG. 1A.

The above materials can be used as the first layer 2 and the second layer 1, respectively. When the prepreg 3 is heated at a temperature not less than the temperature at which a resin included in the first layer 2 melts while applying pressure, the resin included in the first layer 2 melts and flows into the second layer 1, and thus, as shown in FIG. 1B, a third layer 5 and a forth layer 4 are formed integrally into a composite material 6. The fourth layer 4 is configured in such a manner that the resin included in the first layer 2 is arranged in the pores of the second layer 1. That is, the molten resin flows from the first layer 2 to the second layer 1.

The prepreg 3 with high compressibility can be produced by including the second layer 1, even if an insulating material with low compressibility is used as the first layer 2. So far, it has been impossible to achieve favorable compression when such an insulating material is heated and pressed by itself.

Next, another example of a prepreg of the present invention will be described by referring to FIGS. 2A and 2B.

Figure 2A:
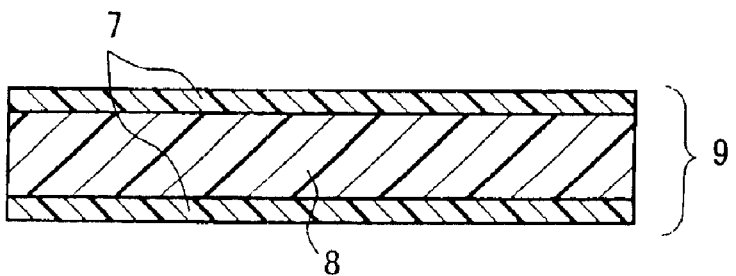
FIG. 2A is a schematic cross-sectional view showing an example of a prepreg of the present invention.
Figure 2B:
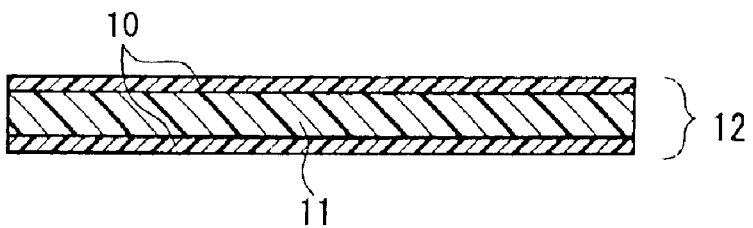
FIG. 2B is a schematic cross-sectional view showing a composite material obtained by compressing the prepreg in FIG. 2A.

FIG. 2A is a schematic cross-sectional view showing an example of a prepreg of the present invention. As shown in FIG. 2A, a prepreg 9 has a three-layer structure that includes a first layer 8 and second layers 7 sandwiching the first layer 8. The application of heat and pressure to the prepreg 9 in the same manner as the example in FIG. 1A produces a composite material 12, as shown in FIG. 2B. In FIG. 2B, a third layer 11 and fourth layers 10, in which a resin included in the first layer 8 is arranged, are formed integrally into the composite material 12. In this example, the second layers 7 are formed on both sides of the first layer 8. Therefore, both surfaces of the prepreg 9 have compressibility, so that the prepreg 9 can be compressed more effectively.

Next, yet another example of a prepreg of the present invention will be described by referring to FIGS. 3A and 3B.

Figure 3A:
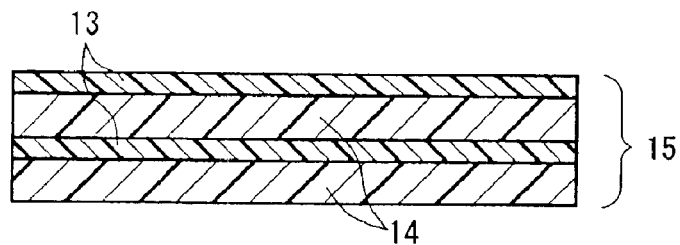
FIGS. 3A and 3B are schematic cross-sectional views showing an example of a prepreg of the present invention.
Figure 3B:
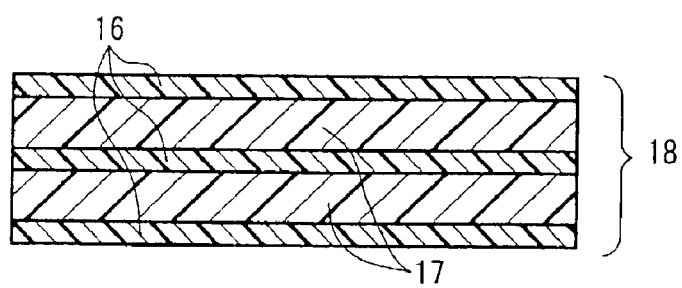

FIGS. 3A and 3B are schematic cross-sectional views showing an example of a prepreg of the present invention. In FIG. 3A, a prepreg 15 has a four-layer structure that includes alternate layers of first layers 14 and second layers 13. In FIG. 3B, a prepreg 18 has a five-layer structure that includes alternate layers of first layers 17 and second layers 16.

As shown in FIG. 3A, only one surface of the prepreg 15 is provided with the second layer 13. As shown in FIG. 3B, both surfaces of the prepreg 18 are provided with the second layers 16. Moreover, the second layer also is formed inside the prepregs 15, 18. Referring to FIGS. 3A and 3B, each of the prepregs 15, 18 has only one second layer formed therein. However, a plurality of second layers may be present inside the prepreg, as long as the first layer and the second layer are stacked alternately.

Like the examples shown in FIGS. 1A to 2B, these prepregs can be compressed effectively by applying heat and pressure, even if an insulating material, which has low compressibility by itself, is used as the first layer. Since the second layer also is formed inside the prepreg, the examples in FIGS. 3A and 3B can more effectively improve the compressibility than those in FIGS. 1A to 2B.

The above methods can produce a prepreg with favorable compressibility by using any materials that have the necessary physical properties, regardless of a specific insulating material.

Embodiment 2

Figure 4A:
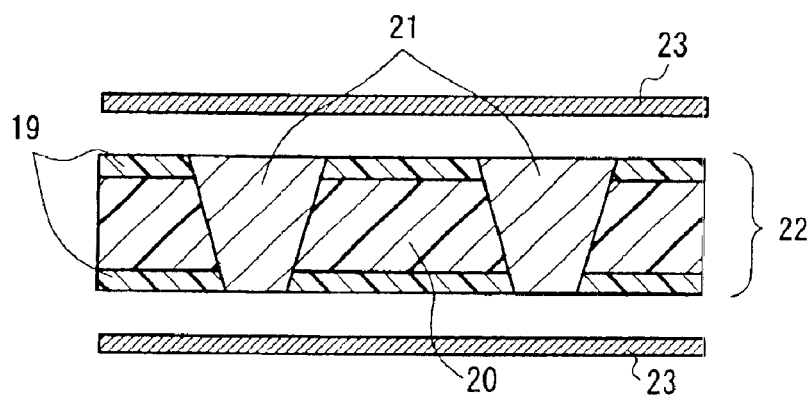
FIGS. 4A and 4B are schematic cross-sectional views showing an example of a prepreg, a board for forming a circuit, and a manufacturing method of a circuit board of the present invention.

FIG. 4A is a schematic cross-sectional view showing an example of a prepreg of the present invention. As shown in FIG. 4A, a prepreg 22 is a laminate that includes a first layer 20 and second layers 19 stacked on both sides of the first layer 20. Through holes are formed in the laminate in its thickness direction and filled with a conductive paste 21.

Figure 4B:
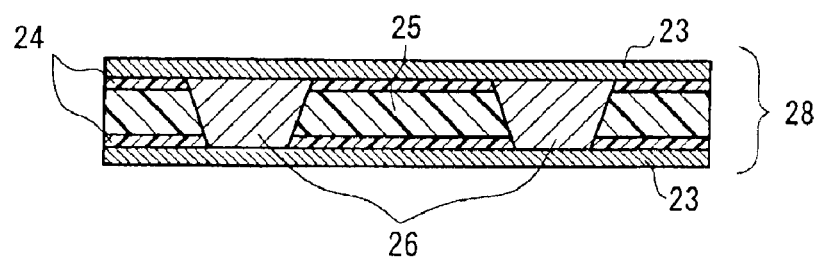

Metal foils 23 are deposited on both surfaces of the prepreg 22, followed by the application of heat and pressure. As shown in FIG. 4B, a resin included in the first layer 20 flows into the second layers 19, and thus the prepreg 22 is compressed. The second layers 19 and the first layer 20 become fourth layers 24 and a fifth layer 25, respectively. At the same time, the conductive paste 21 is compressed into an electrical conductor 26, thereby making a good electrical connection between the metal foils 23 and the electrical conductor 26. In this manner, a board 28 for forming a circuit that has favorable electrical conductivity can be obtained. Moreover, it is possible to produce a circuit board by processing the metal foils 23 of the board 28 into wiring patterns.

When the compressibility of the first layer 20 is low, a conventional prepreg that does not include the second layer 19 cannot be compressed sufficiently by applying heat and pressure. This may prevent a good electrical connection between the electrical conductor 26 and the metal foils 23, causing problems in a circuit board, such as a higher resistance, an increase in resistance variations, a reduction in connection stability, and degradation in environmental test reliability.

Moreover, the molten resin in the first layer 20 moves to reduce the adhesion between the metal foils 23 (to be used as metal for wiring) and the first layer 20, which also may lead to degradation in environmental test reliability.

In contrast, this embodiment can provide a board for forming a circuit that has favorable electrical conductivity and a circuit board that has the effects of lowering resistance, reducing resistance variations, increasing connection stability, and improving environment test reliability.

The second layers 19 also serve as a reinforcing material for the first layer 20 in this embodiment. Therefore, when the prepreg is compressed, the second layers 19 can prevent the molten resin in the first layer 20 from moving in the in-plane direction of the prepreg. By suppressing such a movement of the resin, the adhesion between the metal foils 23 and the insulating layer, in which the first layer 20 and the second layers 19 are integrally formed by compression, can be enhanced. Consequently, high durability, i.e., high resistance to temperature and humidity can be achieved even after the metal foils 23 have been processed into wiring patterns.

A method for forming holes is not particularly limited. For example, conventional methods for processing holes in a circuit board can be used, including a laser process that uses a carbon dioxide gas laser or YAG laser and a machining process that uses a drill or puncher.

When a through hole is formed with a laser, the through hole generally is tapered, and thus the hole diameter in one surface of the prepreg differs from that in the other surface. If there is a difference in the hole diameter, the type of second layers, or the type of metal foils between the upper and the lower surface of the prepreg, the second layers with different average pore diameter and/or porosity may be stacked on both surfaces of the prepreg. Alternatively, the upper and the lower surface of the individual second layers may differ from each other in average pore diameter and/or open area ratio. Thus, the compression of both surfaces of the prepreg can be controlled arbitrarily, so that a board for forming a circuit can be produced in a more desirable condition.

As the conductive paste for filling holes, e.g., a resin composition containing a conductive filler can be used. The conductive paste is compressed into an electrical conductor when the prepreg is heated and pressed, thereby improving the conductivity.

The conductive filler is not particularly limited, as long as it has conductivity. It is preferable to use a filler made of at least one metal selected from gold, silver, copper, nickel, palladium, lead, tin, indium and bismuth, or an alloy or a mixture of these metals. A coated filler also can be used. The coated filler is obtained by coating particles of oxide, such as alumina and silica, or organic synthetic resin with the metal or alloy described above. The shape of the filler is not particularly limited, and fillers in various forms, e.g., powder, fiber, granulated powder, spherical particles, or a mixture of these materials can be used.

A binder resin of the conductive paste is not particularly limited. Examples of the binder resin include a liquid epoxy resin, a polyimide resin, a cyanate ester resin, and a phenol resol resin.

The epoxy resin is not particularly limited, and can be a glycidyl ether epoxy resin such as a bisphenol A epoxy resin, bisphenol F epoxy resin and bisphenol AD epoxy resin, or an epoxy resin containing at least two epoxy groups such as an alicyclic epoxy resin, glycidyl amine epoxy resin and glycidyl ester epoxy resin. If necessary, additives such as a solvent or dispersing agent can be present in the resin. Examples of the additives include butyl cellosolve, ethyl cellosolve, butyl carbitol, ethyl carbitol, butyl carbitol acetate, ethyl carbitol acetate, and α-terpineol.

The electrical conductor is not limited to the above conductive paste. For example, an interstitial via connection material that has conductivity by pressure may be used, such as a via post made of gold, silver, copper, nickel, palladium, lead, tin, indium or bismuth.

A method for filling the holes with the conductive paste is not particularly limited. For example, a printing process can be used. In the printing process, e.g., the prepreg having holes is placed on a vacuum absorption table via a paper mat so that a conductive paste is filled by printing. The printing process allows a resin component in the conductive paste to be absorbed in the paper mat due to the vacuum absorption effect and the capillarity of the paper mat, thus increasing the filling density of conductive particles in the holes. At the same time, since a space is generated between the conductive particles, the filling density of the conductive particles can be increased further when the prepreg is compressed in manufacturing a circuit board.

The metal foil is not particularly limited. For example, a conventional copper foil for a circuit board, such as an electrolytic copper foil and a rolled copper foil, can be used. Though the thickness of the metal foil is not particularly limited, it is preferable that the metal foil has a thickness of about 9 µm to 35 µm, in view of workability and productivity.

The following is an explanation of the application of heat and pressure to a prepreg. The conditions of heating and pressing depend on materials to be used as the prepreg. For a prepreg that includes a first layer obtained by impregnating aramid nonwoven fabric with an epoxy resin as described above, it is preferable to perform the application of heat and pressure at 200° C. and 5 MPa (50 kgf/cm$^2$) for one hour. For a prepreg that includes a first layer obtained by forming a polyimide adhesive (with a thickness of about 6 µm) on a polyimide film (with a thickness of 13 µm), it is preferable to perform the application of heat and pressure at 200° C. and 15 MPa (150 kgf/cm$^2$) for one hour.

As shown in FIGS. 4A and 4B, the prepreg 22 is compressed by causing the resin to flow from the first layer 20 to the second layers 19. Therefore, when the prepreg 22 is heated and pressed, it is necessary to control the compressibility of the prepreg 22.

The compressibility of a prepreg is, e.g., in the range of 2% to 30%. Even with a compressibility of less than 2%, the electrical connection of the through holes can be ensured, e.g., by the protrusion of a conductive paste. When the compressibility is not less than 2%, sufficient compressive force is exerted on a contact portion between conductive fillers in the conductive paste and a contact portion between the conductive paste and the metal foil. Therefore, the conductive paste and the metal foil can adhere firmly to each other, thus making it possible to reduce interstitial via connection resistance and to improve connection stability. When the compressibility is approximately more than 30%, the resultant circuit board may be deformed or the internal stress may be left, though it depends on the materials to be used as the prepreg and the conductive paste.

Figure 5A:
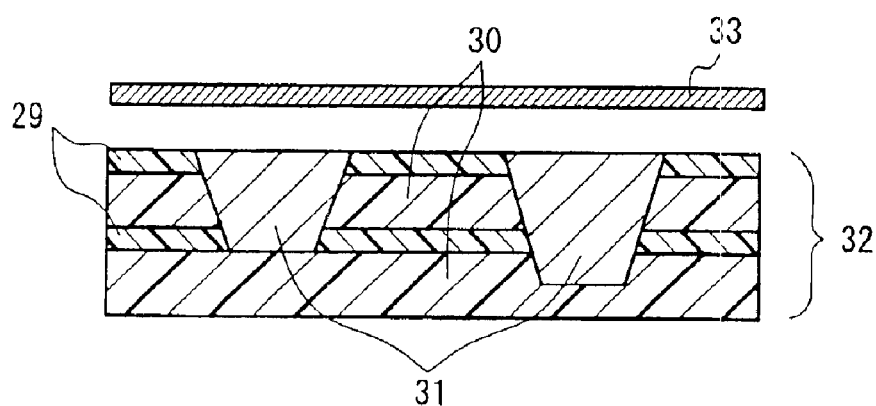
FIGS. 5A and 5B are schematic cross-sectional views showing an example of a prepreg, a board for forming a circuit, and a manufacturing method of a circuit board of the present invention.

FIG. 5A is a schematic cross-sectional view showing an example of a prepreg of the present invention. As shown in FIG. 5A, a prepreg 32 has a four-layer structure that includes alternate layers of first layers 30 and second layers 29. Blind via holes in the prepreg 32 are filled with a conductive paste 31.

Figure 5B:
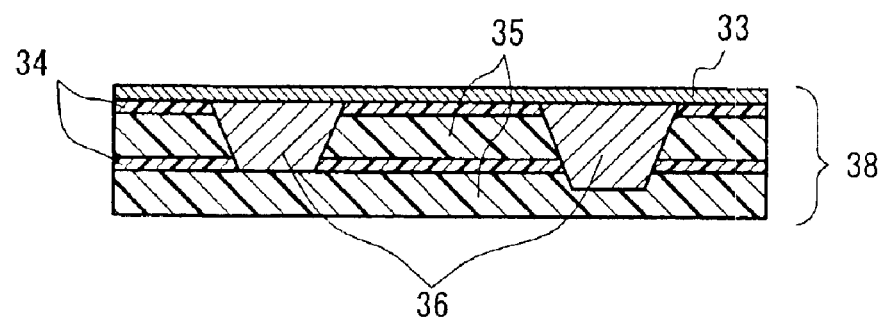

Like the example shown in FIGS. 4A and 4B, the first layers 30 and the second layers 29 are stacked, the blind via holes are formed, e.g., with laser processing, and the blind via holes are filled with the conductive paste 31, thereby producing a prepreg 32. A metal foil 33 is stacked on the surface of the prepreg 32 to which the conductive paste 31 is exposed, followed by the application of heat and pressure. Consequently, as shown in FIG. 5B, the resin included in the first layers 30 flows into the second layers 29, and thus the second layers 29 and the first layers 30 become fourth layers 34 and fifth layers 35, respectively. At the same time, the prepreg 32 is compressed into a board 38 for forming a circuit, the board 38 having the metal foil 33 that is deposited on one surface thereof. The metal foil 33 is processed into a wiring pattern, thereby achieving a circuit board.

In this example, the same effect as that of the example shown in FIGS. 4A and 4B can be obtained at the surface on which the metal foil 33 is deposited. In this example, another prepreg, board for forming a circuit, or circuit board also may be laminated on the surface on which the metal foil 33 is not deposited.

When there are many spaces in a prepreg, as with a conventional prepreg, the dimensions of the prepreg are changed easily due to temperature, humidity, external force, or the like in the environment. However, a prepreg of the present invention can decrease such a dimensional change because the first layer, which serves as a structure of the prepreg, is covered with a matrix resin.

Embodiment 3

FIGS. 6A to 6F are schematic cross-sectional views showing an example of a method for manufacturing a circuit board of the present invention and correspond to individual steps in the manufacturing method.

Figure 6A:
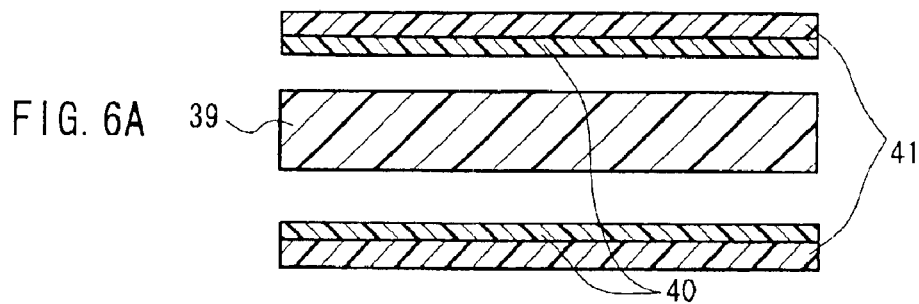
FIGS. 6A to 6F are schematic cross-sectional views showing an example of a manufacturing method of a circuit board of the present invention and correspond to individual steps in the manufacturing method.

First, a first layer 39 and a release film 41 provided with a second layer 40 are prepared (FIG. 6A).

Figure 6B:
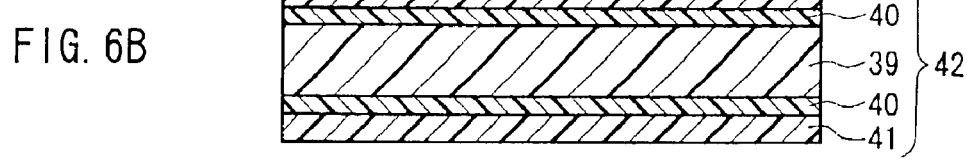

Then, the release films 41 are laminated on both surfaces of the first layer 39 so that the second layers 40 come into contact with the first layer 39, resulting in a prepreg 42 on which the release films 41 are stacked (FIG. 6B).

Figure 6C:
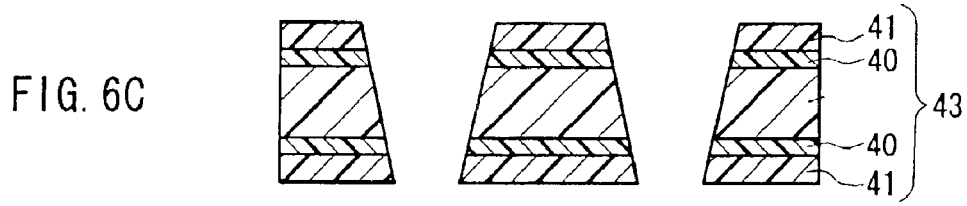

Subsequently, through holes are formed in the prepreg with laser processing, so that a prepreg 43 having the through holes is prepared (FIG. 6C). At this time, the through holes penetrate the first layer 39, the second layers 40, and the release films 41.

Figure 6D:
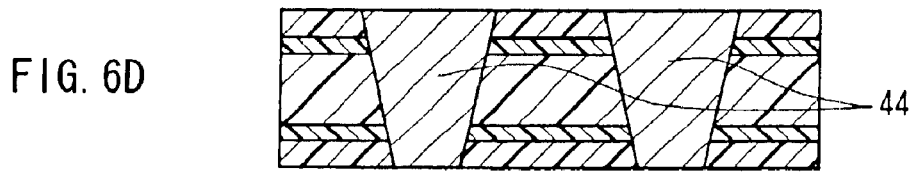

The through holes are filled with a conductive paste 44 with a printing process (FIG. 6D).

Figure 6E:
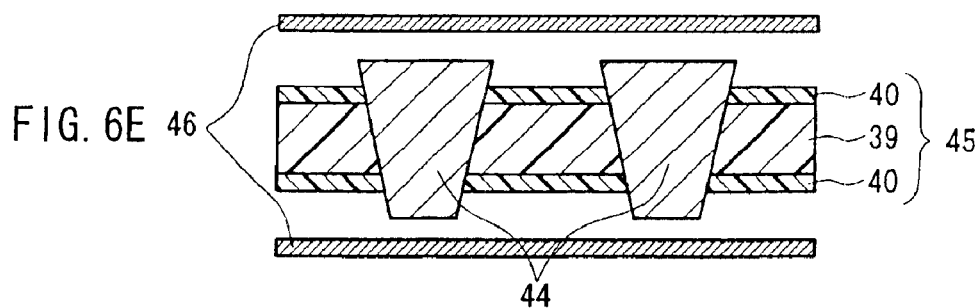

Only the release films 41 are removed while leaving the second layers 40 on the first layer 39, thus forming a prepreg 45 (FIG. 6E).

Metal foils 46 are deposited on both surfaces of the prepreg 45 (FIG. 6E), which then is heated and pressed so as to compress the prepreg 45. At this time, the prepreg 45 is compressed effectively due to the second layers 40, and thus the density of the conductive paste 44 is increased to form an electrical conductor with low resistance. Accordingly, a good stable electrical connection can be made between the electrical conductor and the metal foils 46.

Figure 6F:
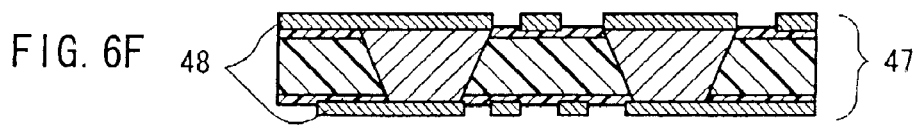

Finally, the metal foils 46 are processed into wiring patterns 48, thereby achieving a circuit board 47 (FIG. 6F).

The wiring pattern may be formed by conventional methods used in manufacturing a circuit board, e.g., photolithography.

The release film is not particularly limited, as long as it can resist temperatures of not less than 100° C. and have favorable processability in forming holes. Examples of the release film include a polyester film, polyimide film, and polyamide film. As the polyester film, e.g., a polyethylene terephthalate (PET) film or polyethylene naphthalate (PEN) film can be used. The release film is not only used as a mask for forming the through holes, but also has the effect of increasing the conductive paste to be filled by the amount corresponding to the thickness of the release film. As shown in FIG. 6E, the conductive paste 44 protrudes from the prepreg 45 when the release films are removed. Such protrusions also contribute to an improvement in compressibility of the conductive paste while the prepreg is heated and pressed.

When the first and the second layer are preheated in forming a laminate, part of the resin included in the first layer melts and a small amount of the molten resin can flow into the second layer. In this case, the first and the second layer adhere to each other, so that the resin included in the first layer can flow into the second layer more favorably while the prepreg is heated and pressed.

The above method allows the second layer to be deposited easily on the surface of the first layer. When the second layer is formed on a base material by application, the base material may be deposited on the first layer as the release film.

The above method can provide a circuit board with good electrical connection and high durability, regardless of, e.g., the materials and physical properties of the first and the second layer. Using the prepreg whose conductive paste protrudes past the release films makes it possible to provide a circuit board having lower interstitial via connection resistance and higher connection stability because of its synergistic effect.

As described above, the wiring patterns are formed after the prepreg having the metal foils on both surfaces is heated and pressed. However, it is also possible to form the wiring patterns on the surfaces of a prepreg beforehand, and then the prepreg is heated and pressed to provide a circuit board.

Embodiment 4

FIGS. 7A to 7F are schematic cross-sectional views showing an example of a method for manufacturing a circuit board of the present invention and correspond to individual steps in the manufacturing method.

Figure 7A:
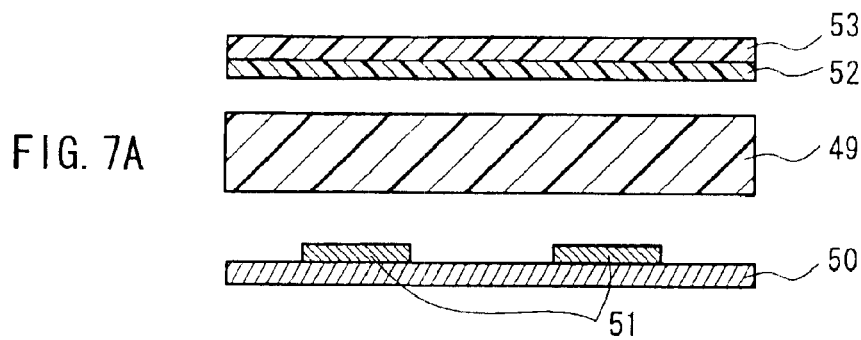
FIGS. 7A to 7F are schematic cross-sectional views showing an example of a manufacturing method of a circuit board of the present invention and correspond to individual steps in the manufacturing method.
Figure 7B:
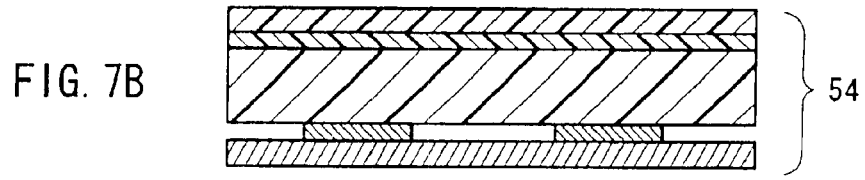

First, as shown in FIG. 7A, a transfer film 50 having a wiring pattern 51 is deposited on one surface of a first layer 49 so that the wiring pattern 51 comes into contact with the first layer 49. A release film 53 having a second layer 52 is deposited on the other surface of the first layer 49 so that the second layer 52 comes into contact with the first layer 49. Thus, a prepreg 54 is prepared (FIG. 7B).

Figure 7C:
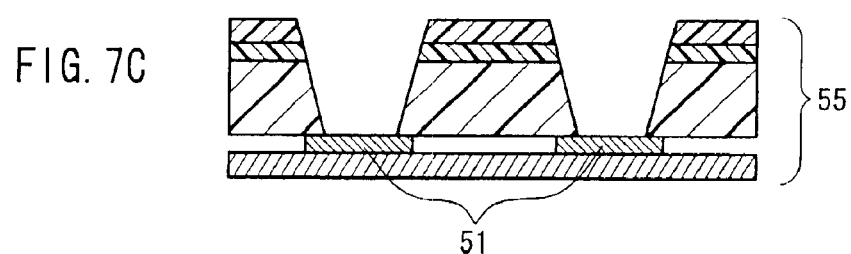

Then, blind via holes are formed so as to expose the wiring pattern 51 with laser processing, so that a prepreg 55 having the blind via holes is prepared (FIG. 7C).

Figure 7D:
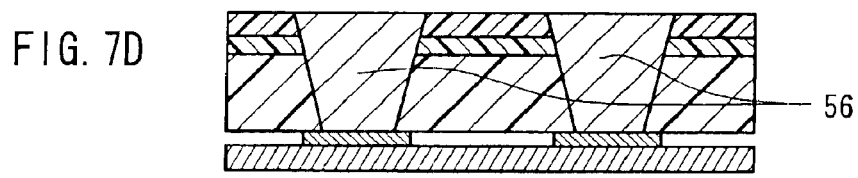

Subsequently, the blind via holes are filled with a conductive paste 56 with printing process (FIG. 7D).

Figure 7E:
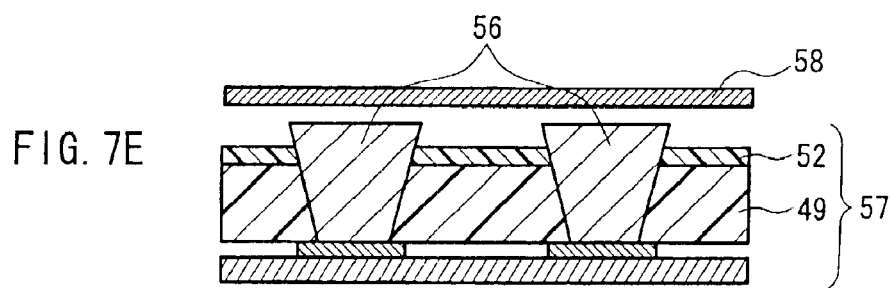

Only the release film 53 is removed while leaving the second layer 52 on the first layer 49, thus forming a prepreg 57 (FIG. 7E).

A metal foil 58 is stacked on the surface of the prepreg 57 to which the conductive paste 56 is exposed, which then is heated and pressed so as to compress the prepreg 57. At this time, the prepreg 57 is compressed effectively due to the second layer 52, and thus the density of the conductive paste 56 is increased to form an electrical conductor with low resistance. Accordingly, a good stable electrical connection can be made between the electrical conductor and the metal foil 58.

Figure 7F:
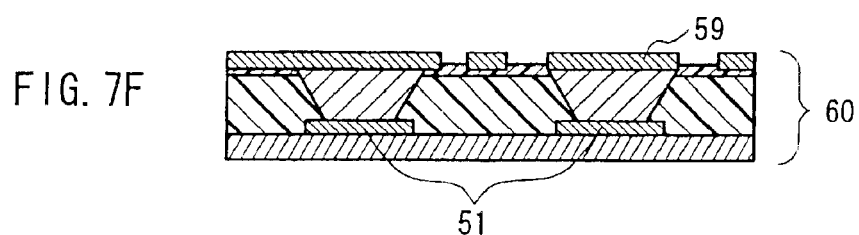

Finally, the metal foil 58 is processed into a wiring pattern 59, thereby achieving a circuit board 60 (FIG. 7F).

The above method allows the second layer to be deposited easily on the surface of the first layer. When the second layer is formed on a base material by application, the base material may be deposited on the first layer as the release film.

The above method can provide a circuit board with good electrical connection and high durability, regardless of, e.g., the materials and physical properties of the first and the second layer.

Moreover, this method can utilize the preformed wiring pattern effectively and facilitate manufacturing of a circuit board with various wiring patterns.

As shown in FIG. 7F, the circuit board is produced with the wiring pattern 51 embedded therein. Therefore, the conductive paste can be compressed more.

As the transfer film having a wiring pattern, e.g., a commercially available film including an aluminum carrier on which a copper foil is stacked via a release layer can be used. In this case, a wiring pattern may be formed previously on the copper foil by etching or the like. It is possible to use, e.g., an iron chloride solution or ammonium persulfate solution for the etching. The aluminum carrier, i.e., the transfer film, also can be removed by etching with hydrochloric acid or the like after the application of heat and pressure. In this case, the resultant circuit board may be the same as that shown in FIG. 6F of Embodiment 3 in shape.

In the above method, the compression effect of the second layer, the protrusion effect of the conductive paste, and the embedding effect of the wiring pattern can be combined to make the compressibility of the prepreg and the conductive paste even greater and more effective.

The wiring pattern may be formed after the prepreg having the metal foil on its one surface is heated and pressed. However, it is also possible to form the wiring pattern on a prepreg beforehand, and then the prepreg is heated and pressed to provide a circuit board.

Embodiment 5

Figure 8A:
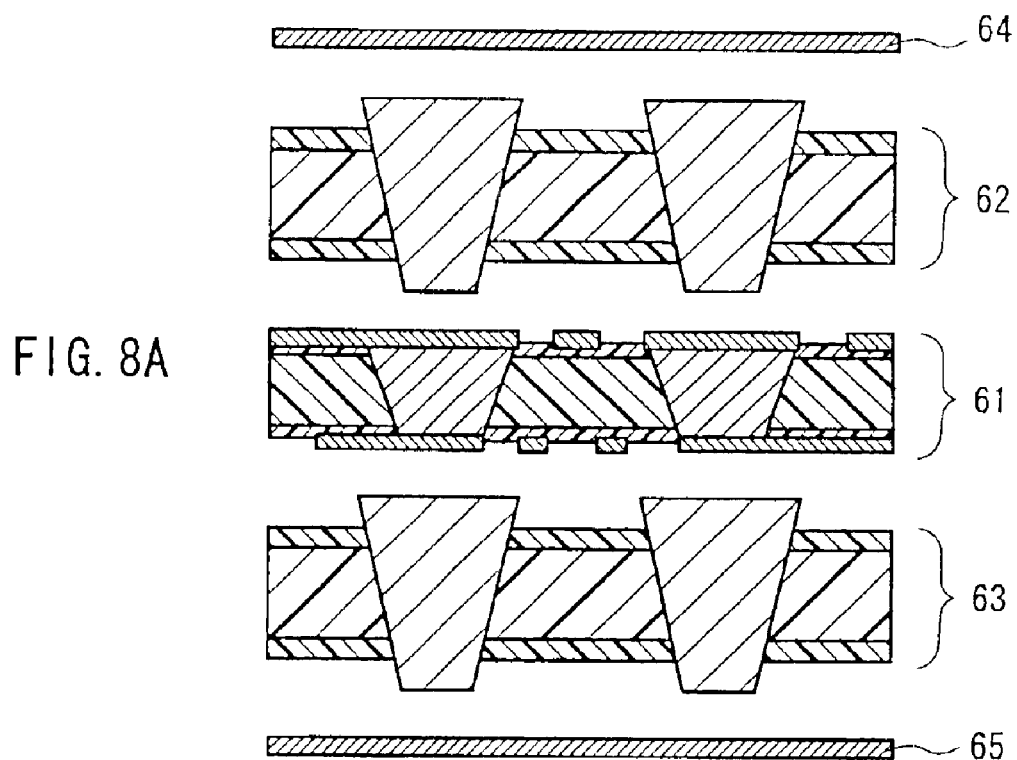
FIGS. 8A and 8B are schematic cross-sectional views showing an example of a manufacturing method of a circuit board of the present invention and correspond to individual steps in the manufacturing method.

An example of another method for manufacturing a circuit board of the present invention will be described by referring to FIGS. 8A and 8B.

A circuit board 61 is produced in the same manner as that in Embodiment 3. Then, prepregs 62, 63 are stacked on both surfaces of the circuit board 61, and metal foils 64, 65 are stacked further on the respective prepregs 62, 63 (FIG. 8A).

Figure 8B:
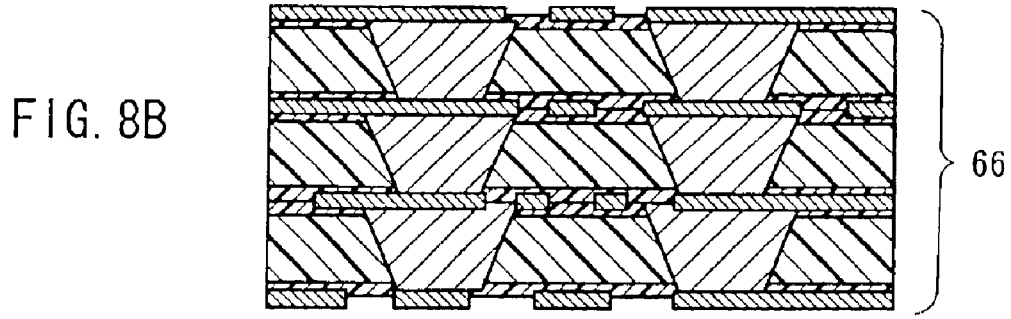

These components are heated and pressed together, and the metal foils on both surfaces are processed into wiring patterns, thereby producing a multi-layer circuit board 66 (FIG. 8B).

As described above, the wiring patterns are formed after the laminate having the metal foils on both surfaces is heated and pressed. However, it is also possible to form the wiring patterns on a laminate beforehand, and then the laminate is heated and pressed to provide a multi-layer circuit board.

By repeating these processes, a multi-layer circuit board with low resistance, stable electrical connection, and high durability can be produced easily, regardless of types and physical properties such as compressibility of the first and the second layer.

In addition to the above materials, other materials can be used as long as they satisfy the characteristics for material and configuration of the invention.

The processing methods used in each process of the embodiments are not limited to those described above, and other methods can be used without departing from the spirit or essential characteristics of the invention.

EXAMPLE

Hereinafter, the present invention will be described in more detail by way of an example. In this example, a circuit board was produced according to the method shown in FIGS. 6A to 6F of Embodiment 3. The present invention is not limited by the following example.

A sample of this example was prepared as follows.

First, an m-aramid porous layer was prepared as a second layer in the following manner.

M-aramid ("CONEX," manufactured by Teijin Ltd.) was dissolved in NMP, and this solution was applied to a PET film (having a thickness of 18 μm), which was a base material. The width of the application was 35 cm. Then, the base material coated with the solution was immersed in methyl alcohol at room temperature, so that a gelled m-aramid layer was formed on the base material. The gelled m-aramid layer was washed with water and dried (in the air, at 80° C.), and thus an m-aramid porous layer having a thickness of 10 μm was formed on the PET film. At this time, the surface of the m-aramid layer on the PET base material side had an open area ratio of 11% and an average pore diameter of 0.3 μm. The opposite surface of the m-aramid layer to the PET base material had an open area ratio of 9% and an average pore diameter of 0.05 μm.

A commercially available glass epoxy layer ("GEA-67N," manufactured by Hitachi Chemical Co., Ltd., corresponding to FR-4) having a thickness of 100 μm was prepared as a first layer. The PET film provided with the m-aramid porous layer was laminated on both surfaces of the glass epoxy layer so that the m-aramid porous layers came into contact with the glass epoxy layer. Thus, a prepreg including the glass epoxy layer and the m-aramid porous layers stuck on both surfaces of the glass epoxy layer was produced.

Next, through holes (having a hole diameter of 200 μm) were formed in the prepreg with laser processing in predetermined patterns. At this time, the through holes penetrated the glass epoxy layer, the PET film, and the m-aramid porous layer.

The through holes were filled with a conductive paste with printing process. As the conductive paste, a mixture of Cu powder and epoxy resin was used.

Subsequently, only the PET film was removed from the prepreg while leaving the m-aramid porous layer on the surface of the epoxy layer. The conductive paste protruded from the through holes of the prepreg by the amount corresponding to the thickness of the removed PET film.

Copper foils (with a thickness of 18 μm) were stacked on both surfaces of the prepreg, and then the prepreg was compressed by applying heat and pressure. The application of heat and pressure was performed with a vacuum hot press at 200° C. and 5 MPa (50 kgf/cm$^2$) for 60 minutes. When a portion of the sample was cut, and the cutting plane was measured with an electron microscope, the measurement showed that the above compression caused the epoxy resin in the glass epoxy layer to melt and flow into the m-aramid porous layer.

Finally, the copper foils were processed into wiring patterns by photolithography and etching. Thus, a circuit board was produced that had a wiring structure in which the wirings on the upper and the lower surface were connected alternately in series through 1600 interstitial via holes. By using the above method, 60 samples were prepared.

Moreover, 60 samples of a circuit board including only an epoxy layer as a first layer were prepared for a conventional example. The manufacturing method and materials were the same as those described above, except for the m-aramid porous layer that was the second layer (i.e., the PET film also was not used in the conventional example).

Figure 9:
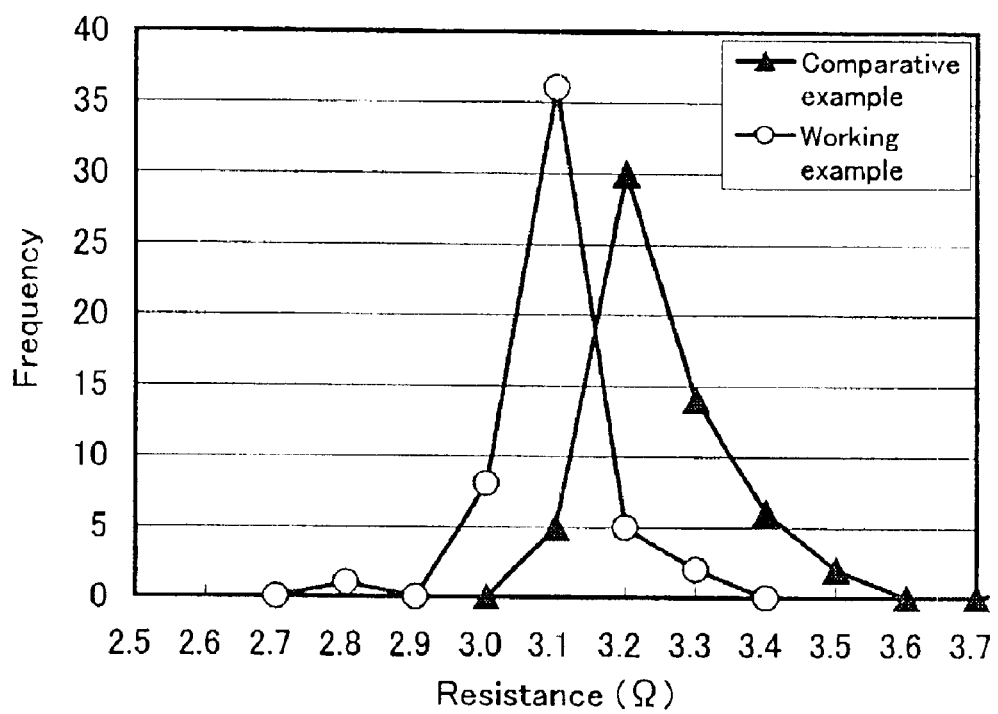
FIG. 9 shows the relationship between interstitial via connection resistance and frequency distribution of a double-sided circuit board, which was measured in an example of the present invention.

The interstitial via connection resistance of the circuit boards thus prepared in the working example and in the comparative example was measured with a DC four-terminal method. FIG. 9 is a graph showing the result. In FIG. 9, the connection resistance in paths that connect 1600 interstitial via holes in series in the above wiring structure is plotted against the frequency.

As can be seen from FIG. 9, the circuit boards in the working example are likely to have lower connection resistance and less variation in the connection resistance as compared with those in the comparative example.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a circuit board comprising:

forming a first layer that is an insulating layer including a resin;

forming a second layer that is a porous layer including pores that connect an upper and a lower surface of the second layer;

forming a laminate of at least one first layer and at least one second layer;

forming via holes through the laminate in a thickness direction and filling the via holes with a conductive paste; and heating and pressing the laminate so that the resin included in the first layer flows and is absorbed into the second layer and the conductive paste is compressed into an electrical conductor, wherein the method further comprises:

depositing at least one selected from a metal foil and a wiring pattern on at least one surface of the laminate after forming the laminate and before heating and pressing the laminate, and the flow of resin included in the first layer into the second layer is controlled by at least one selected from an open area ratio and an average pore diameter of the pores at the upper and the lower surface of the second layer.

2. The method according to claim 1, wherein when the metal foil is deposited on the surface of the laminate, the method further comprises:

processing the metal foil into a wiring pattern.

3. The method according to claim 1, wherein forming the laminate comprises:

applying a solution of resin included in the second layer to a base material;

setting the resin included in the second layer into a gel;

forming the second layer on the base material by washing and drying the gelled resin; and stacking the second layer on at least one surface of the first layer.

4. The method according to claim 3, wherein the resin included in the second layer is set into a gel by replacing a solvent in the solution with another solvent.

5. The method according to claim 3, wherein the resin included in the second layer is aramid.

6. The method according to claim 3, wherein the base material is a film made of resin.

7. The method according to claim 1, wherein forming the laminate comprises:

applying a solution of resin included in the second layer to the first layer;

setting the resin included in the second layer into a gel; and forming the second layer on at least one surface of the first layer by washing and drying the gelled resin.

8. The method according to claim 7, wherein the resin included in the second layer is set into a gel by replacing a solvent in the solution with another solvent.

9. The method according to claim 7, wherein the resin included in the second layer is aramid.

10. The method according to claim 1, wherein the upper and the lower surface of the second layer differ from each other in at least one selected from the open area ratio and average pore diameter.

11. The method according to claim 1, wherein the formation of the second layer and the formation of at least a part of the laminate occur simultaneously by forming the second layer on the first layer.

12. The method according to claim 1, wherein the at least one selected from a metal foil and a wiring pattern is deposited on the at least one surface of the laminate, and the surface is formed by one of the second layers.

* * * * *

UNITED STATES PATENT AND TRADEMARK OFFICE
CERTIFICATE OF CORRECTION

PATENT NO. : 7,045,198 B2
APPLICATION NO. : 10/280762
DATED : May 16, 2006
INVENTOR(S) : Nakagiri et al.

It is certified that error appears in the above-identified patent and that said Letters Patent is hereby corrected as shown below:

Title page, item [57], Abstract, line 14: "are" should read --area--

Signed and Sealed this

Twenty-seventh Day of February, 2007

JON W. DUDAS
*Director of the United States Patent and Trademark Office*